United States Patent [19]
Patti

[11] Patent Number: 6,154,392
[45] Date of Patent: Nov. 28, 2000

[54] FOUR-TERMINAL EEPROM CELL FOR STORING AN ANALOG VOLTAGE AND MEMORY SYSTEM USING THE SAME TO STORE MULTIPLE BITS PER EEPROM CELL

[76] Inventor: Robert Patti, 1 S. 751 Avon Dr., Warrenville, Ill. 60555

[21] Appl. No.: 09/417,040

[22] Filed: Oct. 12, 1999

[51] Int. Cl.$^7$ .................................................. G11C 16/04
[52] U.S. Cl. ............................... 365/185.28; 365/185.14; 365/149
[58] Field of Search .................... 365/185.28, 185.26, 365/102, 185.21, 185.1, 147, 185.14

[56] References Cited

U.S. PATENT DOCUMENTS

| | | | |
|---|---|---|---|
| 4,274,012 | 6/1981 | Simko | 307/238.3 |
| 4,486,769 | 12/1984 | Simko | 357/41 |
| 4,577,215 | 3/1986 | Stewart et al. | 357/23.5 |
| 5,291,439 | 3/1994 | Kauffmann et al. | 365/185 |
| 5,969,991 | 10/1999 | Van Houdt et al. | 365/185.28 |

*Primary Examiner*—David Nelms
*Assistant Examiner*—Thong Le
*Attorney, Agent, or Firm*—Calvin B. Ward

[57] ABSTRACT

A non-volatile memory based on a unique EEPROM memory. The non-volatile memory includes a plurality of data memory cells, a data programming circuit, and a first data line. Each data memory cell includes an EEPROM cell having a separate programming electrode and first and second isolation transistors. The programming electrode is coupled to the floating gate by a tunneling window. The first isolation transistor connects the EEPROM cell to the first data line. The second isolation transistor connects the programming electrode to the data programming circuit in response to a write enable signal. The data programming circuit programs a selected data memory cell by receiving a data value to be stored in that data memory cell and generating and coupling a programming signal to the second isolation transistors, the programming signal having a duration that is determined by the received data value. The memory also includes a plurality of first reference memory cells, a first reference programming circuit, and a first reference line, each first reference memory cell is structurally the same as the data memory cells. There is one first reference memory cell corresponding to each data memory cell, and that first reference cell is programmed with a predetermined value each time the corresponding data memory cell is programmed. A data memory cell is read by comparing the conductance of the first data line to the first reference line. The data reading circuit generates an output value that depends on the compared conductances. In embodiments of the invention using multiple reference cells, the various reference cells are programmed with different fixed values each time the corresponding data memory cell is programmed. The values in these reference cells are interpolated during the reading operation to determine the data value stored in the corresponding data memory cell.

12 Claims, 4 Drawing Sheets

FOUR-TERMINAL EEPROM CELL FOR STORING AN ANALOG VOLTAGE AND MEMORY SYSTEM USING THE SAME TO STORE MULTIPLE BITS PER EEPROM CELL

FIELD OF THE INVENTION

The present invention relates to EEPROM cells, and more particularly, to an EEPROM cell that can be more accurately programmed.

BACKGROUND OF THE INVENTION

EEPROM memory cells are normally used to store a single digital bit per memory cell. However, memories that store more than one bit per memory cell have been described. Such memories are often called "multilevel" memories. Multilevel memories have the potential for significantly reducing the cost per bit of storage.

An EEPROM memory cell may be viewed as a field effect transistor with a gate that is isolated. During programming, charge is transferred to the gate by a tunneling process. The amount of charge stored on the gate determines the conductivity of the source-drain path. To store N bits per memory cell, each memory cell must provide $2^N$ discrete distinguishable states corresponding to $2^N$ different charge levels. The maximum number of bits that can be stored depends on the sensitivity of the circuits used to measure the conductivity and on the ability of the write circuits to precisely control the amount of charge that is transferred to the floating gate during the programming process. While sense circuits having the required precision to store and distinguish 256 are known, the precise programming of the charge still presents problems.

Charge is transferred to the floating gate by causing electrons to tunnel through the oxide that insulates the gate. In EEPROM cells, the tunneling is driven by the application of a voltage between the floating gate and a portion of the channel region of the transistor that includes a tunneling window. During the programming operation, the effective potential on the floating gate is the sum of the potentials created by the charge that has been placed on the gate and the applied electric field that drives the tunneling. Hence, the conductivity of the channel that is measured during the programming will be different from that measured after the tunneling field has been turned off at the end of the programming. Accordingly, the amount of charge on the floating gate at any point in the programming process cannot be accurately determined by measuring the conductivity of the channel during the programming process. Furthermore, the memory cell to memory cell variations do not permit programming based on predetermined programming time for each possible charge level. This situation is further complicated by the fact that the charge transfer rate depends on the amount of charge already on the floating gate.

Hence, to obtain the programming precision required for multilevel cells, iterative programming algorithms are used. These algorithms apply the tunneling field for some period of time. The tunneling field is then turned off and the amount of charge that was stored measured. The process is repeated until the desired charge level has been provided.

Such iterative programming techniques suffer from two problems. First, the time needed to write a memory cell can be quite long. It should be noted that the memory cell must be allowed to settle before the charge can be measured. Second, the accuracy with which the cell can be programmed is limited by the size of the increments in the charge used in each iteration. The programming error will be typically one half the increment of charge transferred in the final step of the iteration. Hence, if small increments are used to provide precision, a very large number of iterations will be needed leading to unacceptable write times. If large increments are used, the precision will be too low to provide a high number of bits per cell. These problems rapidly increase in severity as the number of bits per to be stored in each cell increases.

A second problem that limits the number of bits that can be stored per memory cell arises from the finite rate at which charge leaks off of the floating gate. This leakage problem is not critical in memory cells that store one bit per memory cell since roughly half of the charge would need to leak off the floating gate before an error occurs. Accordingly, one bit memory cells have retention times measured in years. In memory cells that store N bits, an error will occur when the amount of charge that leaks off reaches $2^{-(N+1)}$. Hence, if a one bit cell has a retention time of 10 years, a 4 bit cell will have a retention time of less than 8 months, and an 8 bit cell will have a retention time of less than 2 weeks.

Broadly, it is the object of the present invention to provide an improved multilevel EEPROM memory cell and memory employing the same.

It is a further object of the present invention to provide an improved multilevel EEPROM memory cell whose state can be measured while the tunneling field is being applied.

It is a still further object of the present invention to provide a multilevel memory with improved retention time.

These and other objects of the present invention will become apparent to those skilled in the art from the following detailed description of the invention and the accompanying drawings.

SUMMARY OF THE INVENTION

The present invention is a non-volatile memory based on a unique EEPROM memory. The non-volatile memory includes a plurality of data memory cells, a data programming circuit, and a first data line. Each data memory cell includes an EEPROM cell and first and second isolation transistors. The EEPROM cell includes a source region in the substrate, a drain region in the substrate, a channel region connecting the source and drain regions when the channel region is conducting. A floating gate overlies the channel region, the potential on the floating gate determining the conductivity of the channel region. A separate programming electrode is coupled to the floating gate by a tunneling window, and a programming gate overlies the floating gate. The first isolation transistor connects one of the source and drain regions of the EEPROM cell to the first data line in response to a selection control signal that is coupled to that isolation transistor. The second isolation transistor connects the programming electrode to the data programming circuit in response to a write enable signal that is coupled to that second isolation transistor. The data programming circuit programs a selected one of the data memory cells by receiving a data value to be stored in that data memory cell and generating and coupling a programming signal to the second isolation transistors, the programming signal having a duration determined by the received data value. The data programming circuit includes a conductance comparison circuit that compares the conductance of the first data line with a conductance value determined by the data value and terminates the programming signal when the compared conductances have a predetermined relationship. The memory also includes a plurality of first reference memory cells, a first reference programming circuit, and a first reference line, each first reference memory cell is structurally the same as the data memory cells. The first isolation transistor of each reference memory cell connects one of the source and drain regions of the EEPROM cell to the first reference line in response to a selection control signal that is coupled to that isolation transistor. The second isolation transistor connects the programming electrode to the first reference programming circuit in response to a write enable signal that is coupled to that second isolation transistor. The first reference programming circuit programs a selected one of the reference data cells by coupling a first reference programming signal to the second isolation transistors. There is one first reference memory cell corresponding to each data memory cell, and that first reference cell is programmed each time the corresponding data memory cell is programmed. A data memory cell is read by comparing the conductance of the first data line to the first reference line when the EEPROM cell in the selected data memory cell is connected to the first data line and the EEPROM memory cell in the corresponding reference memory cell is connected to the first reference line. The data reading circuit generates an output value that depends on the compared conductances. In embodiments of the invention using multiple reference cells, the various reference cells are programmed with different fixed values each time the corresponding data memory cell is programmed. The values in these reference cells are interpolated during the reading operation to determine the data value stored in the corresponding data memory cell. In the preferred embodiment of the present invention, the EEPROM cells are constructed such that the floating gate and the programming gate are capacitively coupled with a coupling capacitance of $C_{pf}$, and the programming electrode and the floating gate are capacitively coupled with a coupling capacitance of $C_{if}$, wherein Cpf>10 $C_{if}$.

DETAILED DESCRIPTION OF THE INVENTION

Figure 1:
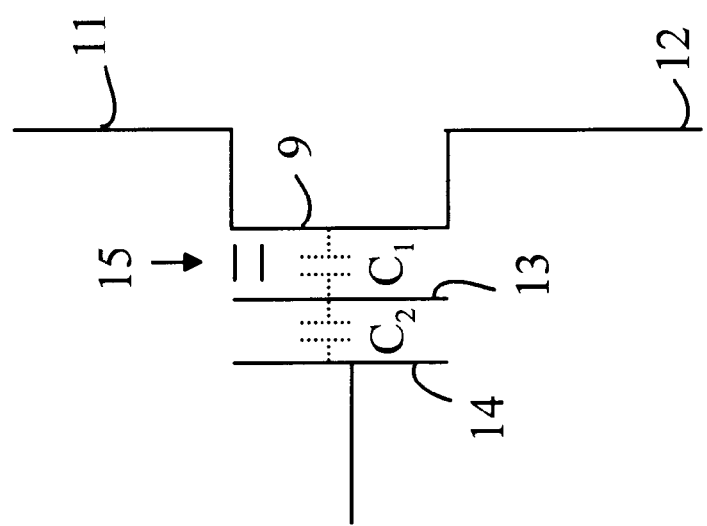
FIG. 1 is a schematic drawing of a conventional EEPROM cell 10.

The manner in which the present invention provides its advantages may be more easily understood with reference to FIG. 1 which is a schematic drawing of a conventional EEPROM cell 10. Charge is stored on a floating gate 13, which overlies the channel 9 of a field effect transistor having a source 11 and drain 12. This gate is completely surrounded by silicon dioxide. Floating gate 13 is capacitively coupled to the channel and to control gate 14 as indicated by the capacitors shown in phantom between these gates. The conductivity of the channel is controlled by the voltage on floating gate 13. This voltage, in turn, depends on the charge stored on the floating gate.

Charge is moved between the channel and the floating gate by applying a sufficient voltage between the floating gate and the channel to cause the charge to tunnel through a tunneling window 15. To program the device, control gate 14 is held at ground and a voltage is applied to source 11. A portion of this voltage is capacitively coupled to floating gate 13. The portion of the voltage that appears on floating gate 13 depends on the relative values of $C_1$ and $C_2$. Since the floating gate must overlie the full width of the channel to control conductivity in the channel, $C_1$ is roughly equal to $C_2$ and the floating gate is elevated to a potential that is roughly half of the programming voltage.

Prior art EEPROM cells that utilize a separate programming electrode transfer a somewhat smaller fraction of the programming voltage to the floating gate; however, the amount transferred is still too high to allow continuous programming. For example, U.S. Pat. No. 4,853,895, which is hereby incorporated by reference, teaches an EEPROM cell in which a separate programming electrode is constructed in a hole in the programming gate to solve certain leakage problems encountered when the tunneling window is too near the channel.

The presence of this programming voltage on the floating gate makes any determination of the amount of charge on the floating gate very difficult. In addition, the requirement that the source be maintained at the programming voltage makes it difficult to construct a measurement circuit that allows the conductivity of the channel to be measured during the programming operation. Hence, as noted above, prior art devices are required to suspend the programming operation each time a determination of the charge on the gate is to be made.

Figure 2:
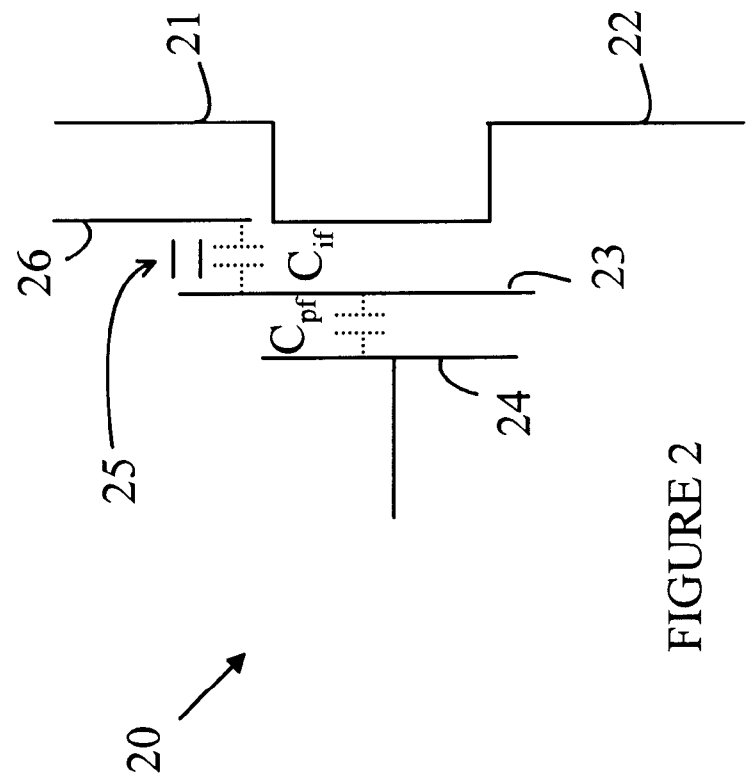
FIG. 2 is a schematic drawing of one embodiment of an EEPROM cell 20 according to the present invention.

The present invention avoids these problems by utilizing a separate programming electrode as shown in FIG. 2, which is a schematic drawing of one embodiment of an EEPROM cell 20 according to the present invention. EEPROM 20 is similar to conventional EEPROMs in that it has a floating gate 23 that controls the conductivity of the channel between a source 22 and a drain 21. Charge is moved to and from the floating gate via a tunneling window 25. The present invention utilizes a separate programming electrode 26 to apply the programming voltage. The present invention differs from prior art EEPROM cells that utilize a separate programming electrode in terms of the capacitative coupling between the programming electrode and the gates. Unlike prior art devices, the capacitative coupling of programming electrode 26 to the floating gate is selected to be a small fraction of the capacitative coupling between floating gate 23 and programming gate 24.

Programming electrode 26 only needs to overlie the floating gate over the small region in which the tunneling window is created. Accordingly, the capacitive coupling between programming electrode 26 and floating gate 23 is much smaller than that between the channel and the floating gate. In addition, this capacitance is much smaller than the capacitance between floating gate 23 and programming gate 24. Denote the capacitance between floating gate 23 and programming electrode 26 by $C_{if}$ and the capacitance between floating gate 23 and programming gate 24 by $C_{pf}$.

Consider a programming operation in which the potential of programming electrode 26 is V and the programming gate is held at ground. Since the $C_{pf} \gg C_{if}$, essentially all of the potential difference will appear between floating gate 23 and programming electrode 26. That is, floating gate 23 will remain essentially at ground. This provides two benefits. First, the voltage needed to program EEPROM 20 is reduced from the values normally needed, since all of the potential is used to drive charge through the tunneling window. Second, the programming voltage does not disturb the potential on the floating gate; hence, the conductivity of the channel reflects the amount of charge currently on the floating gate, not the programming voltage.

It should also be noted that this arrangement frees the source and drain of EEPROM 20 during programming. Accordingly, these terminals can be connected to a circuit that continuously measures the current flowing through the channel. When the current reaches the desired level, the programming voltage is turned off.

EEPROM 20 is erased in a manner that is analogous to the erasure of a conventional EEPROM cell. Programming gate 24 is raised to an elevated voltage while programming electrode 26 is held near ground. Floating gate 23 is then left with a net negative charge referenced to the substrate. It should be noted that the fraction of the erase potential that appears on the floating gate is roughly equal to half of the erase potential, since this voltage is being split capacitively based on the sum of the $C_{if}$ and $C_{ic}$, the capacitive coupling between the channel and the floating gate.

Figure 3:
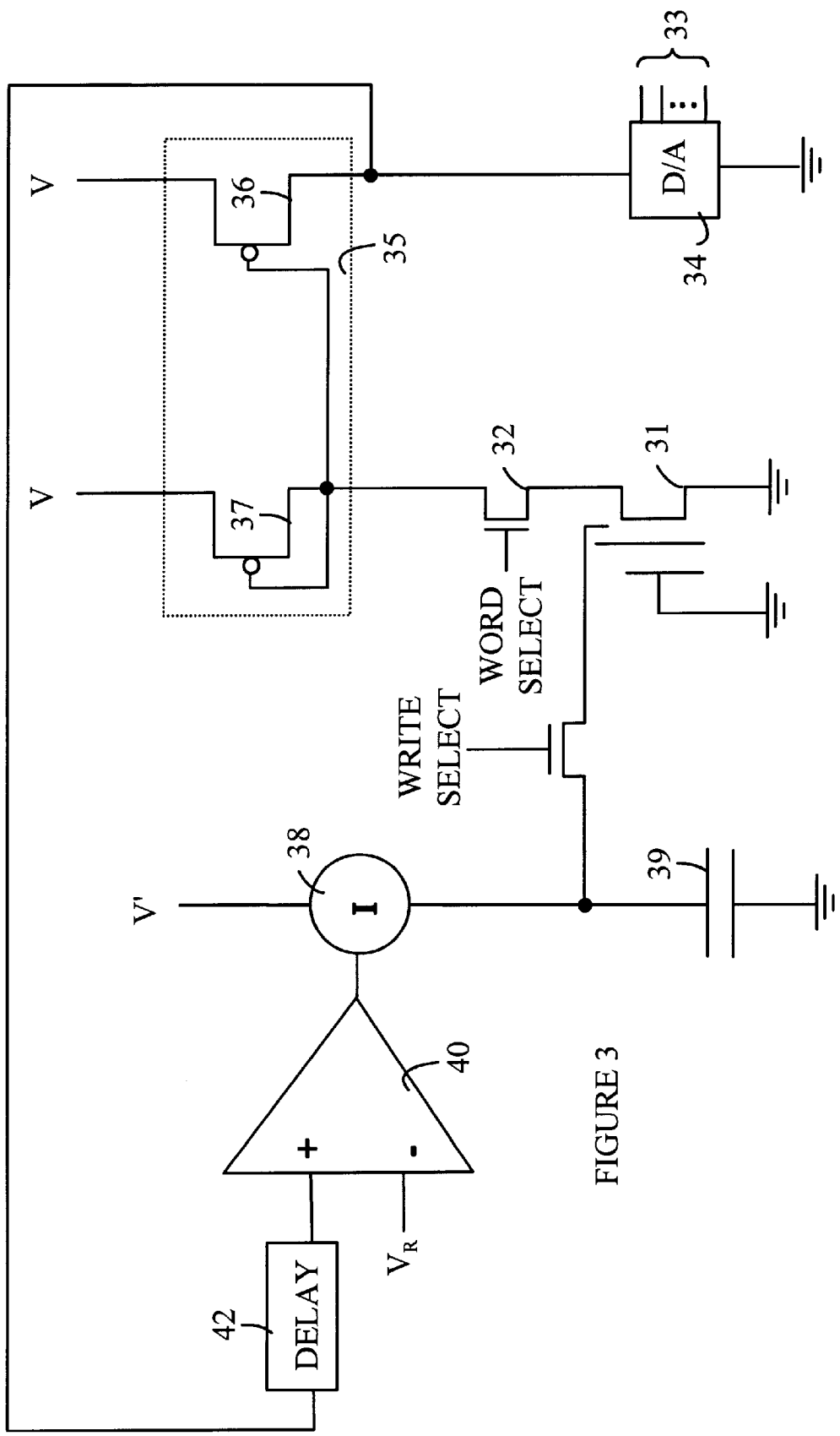
FIG. 3 is a schematic drawing of the write circuitry used in one embodiment of the present invention.

The manner in which the EEPROM is programmed as part of a memory can be more easily understood with reference to FIG. 3, which is a schematic drawing of the write circuitry. Each memory cell in the memory includes an EEPROM and select transistor for that EEPROM. A typical EEPROM and its select transistor are shown at 31 and 32, respectively. The other EEPROMs in the memory have been omitted to simplify the drawing. It is assumed that select transistor 32 is conducting. The multi-bit data value to be programmed into EEPROM 31 is presented on the input lines 33 of a current-based digital to analog converter 34. D/A 34 sets the current that flows through one transistor 36 of a current mirror 35. The other transistor 37 is connected to EEPROM 31. A switchable current source 38 and capacitor 39 generate a ramp that is applied to the programming electrode of EEPROM 31. The slope of the ramp is preferably set such that the potential on the floating gate remains close to that on the programming electrode. When the current flowing through EEPROM 31 reaches a value corresponding to that flowing through D/A 34, comparator 40 switches current source 38 off, and the programming is complete.

While the capacitive coupling between the programming electrode and the floating gate is very small, it is not zero. This results in a small error in the programming of the EEPROM. In effect, comparator 40 "sees" a higher current flowing through EEPROM 31 than will be flowing when the write select is turned off. Whether or not this error is significant depends on the number of bits being stored in EEPROM 31. A first order correction can be applied to correct this error by inserting a delay 42 between current mirror 35 and comparator 40. This delay causes the programming circuit to overshoot since comparitor 40 will be acting on the current produced by a lower programming voltage than currently being applied to EEPROM 31. By adjusting this delay, the error described above can be substantially reduced.

The above-described embodiments of the present invention utilize a ramped signal to program the EEPROM. However, other programming modes can be utilized. For example, the cell can be programmed by applying short pulses to the programming electrode until the EEPROM conducts at the desired level in a manner similar to that utilized in conventional EEPROM programming. In addition, the EEPROM cell can be programmed by applying a DC level to the programming electrode until the cell conducts at the desired level. The ramped approach is preferred because it subjects the gate oxide in the tunneling window to less stress.

If the charged placed on the floating gate did not leak off of the gate, the EEPROM cell could be read in a manner analogous to that used to program the cell. That is, the value stored in the cell would be the value, that when applied to D/A 34 just causes comparitor 40 to change state. In such a system, one would utilize a successive approximation A/D in place of D/A 34.

However, as pointed out above, even EEPROM cells have a finite leak rate that is significant when a large number of bits are being stored in each EEPROM. To overcome this problem, the present invention utilizes a read scheme that corrects for this leakage. It should be noted that the rate of charge leakage from the floating gate depends on the amount of charge stored on the gate. Hence, a non-linear correction is needed. The present invention utilizes a correction mechanism that represents the non-linear correction curve as a piece-wise linear curve.

Figure 4:
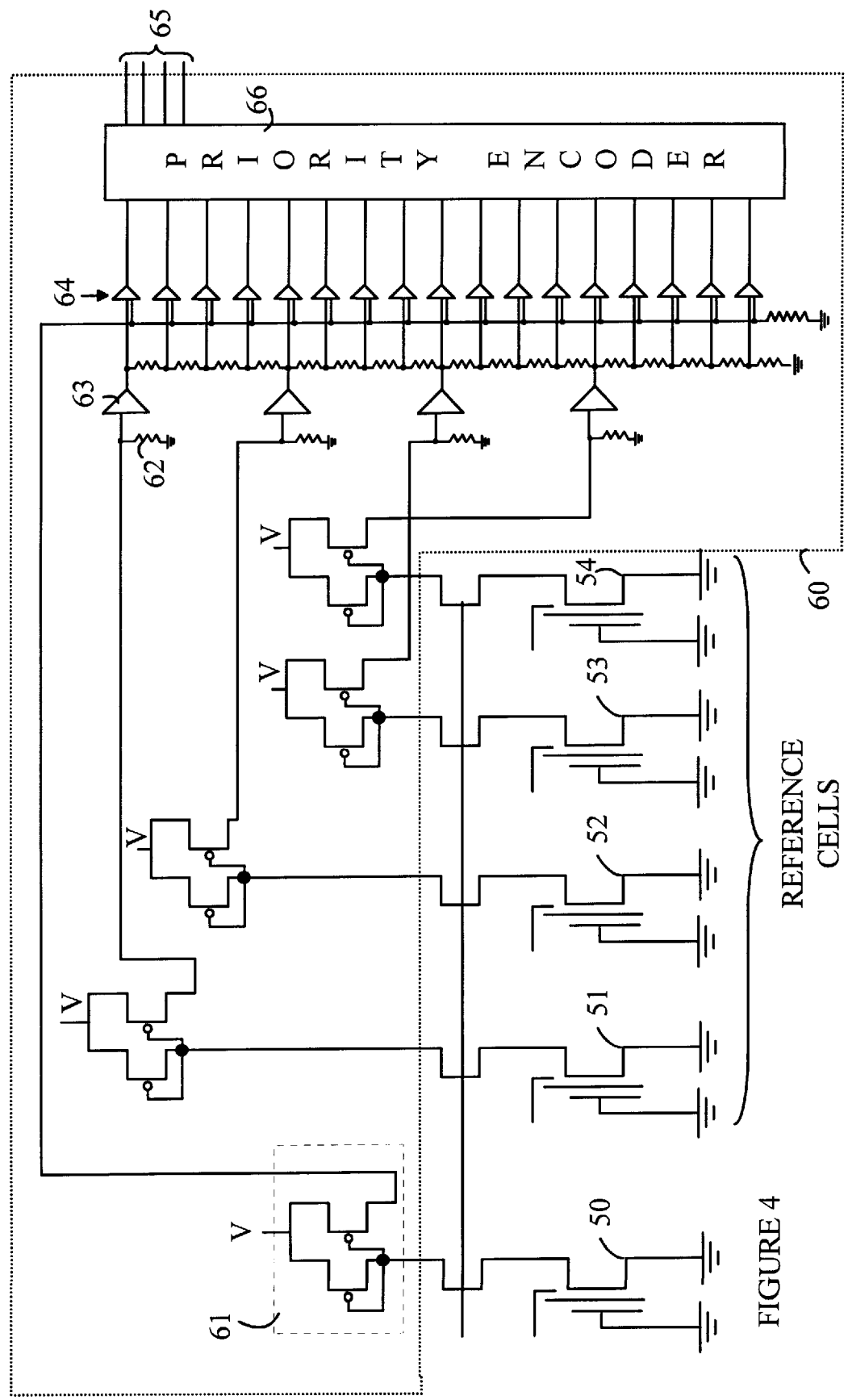
FIG. 4 is a schematic drawing of the read circuit connected to an EEPROM cell and 4 reference cells.

The manner in which the present invention reads an EEPROM cell can be more easily understood with reference to FIG. 4, which is a schematic drawing of the read circuit 60 connected to an EEPROM cell 50 and 4 reference cells 51–54. In general, the EEPROM cells are organized into words comprising a plurality of cells such as cell 50. The words are read and written in parallel. Each word also includes a plurality of reference cells that are written at the same time. Each reference cell is programmed with a different value such that the set of reference cells stores values between the minimum and maximum values that can be stored in the EEPROM cell 50. To simplify the following discussion, it will be assumed that each EEPROM cell stores 4 bits. In this case, reference cell 51 is programmed with 1111, reference cell 52 with 1011, reference cell 53 with 0111, and reference cell 54 with 0011.

The read circuit converts the conductance of each EEPROM cell into a current with the aid of a current mirror. A typical current mirror is shown at 61. The current from EEPROM 50 is then compared to 16 points taken on a piecewise linear curve having four non-linear points defined by reference cells 51–54. The comparison is accomplished by converting each of the currents from the current mirrors to a voltage by passing the current through a resistor such as resistor 62. The resulting voltage is applied to a string of 4 resistors via a unity gain drive circuit 63 to provide four points on the linear curve. The 15 points are compared to the voltage generated by the current mirror on EEPROM 50 by 15 comparators shown at 64. The results of the comparisons are decoded by a priority encoder 65 to produce the output value 66.

Figure 5:
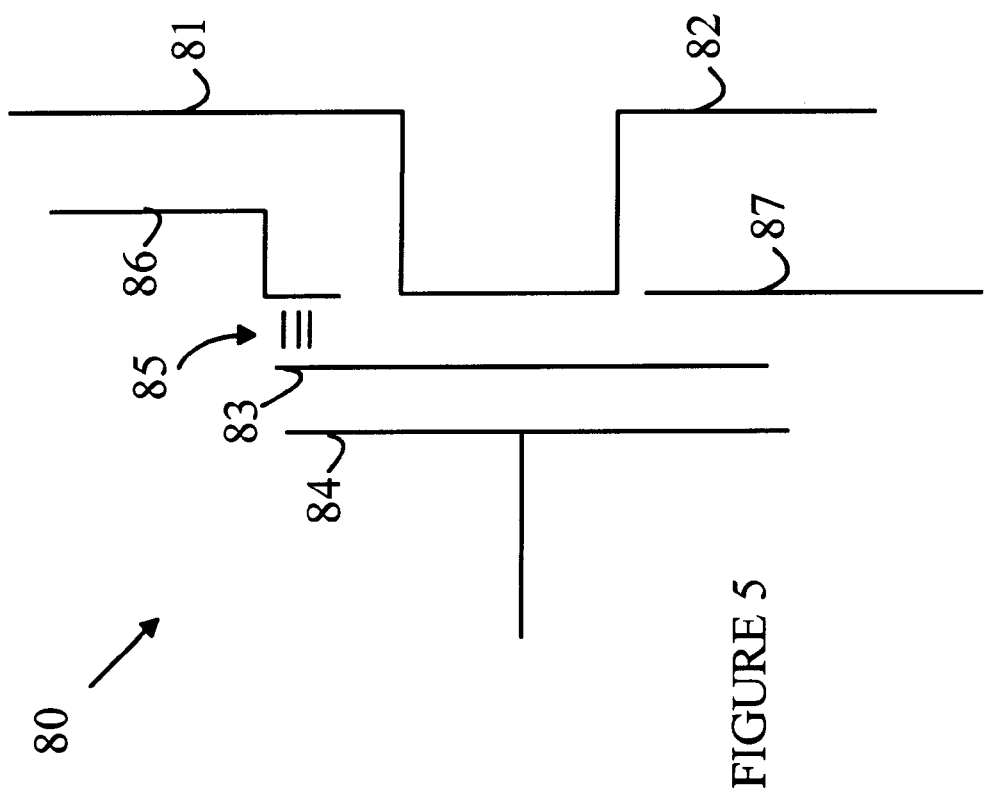
FIG. 5 is a schematic drawing of another embodiment of an EEPROM cell according to the present invention.

As noted above, the finite capacitance between the programming electrode and floating gate causes a small voltage offset on the floating gate during programming that can introduce a significant error in memory systems that store a large number of bits per EEPROM cell. This offset can be eliminated if a second programming electrode is added to the EEPROM cell. Refer now to FIG. 5, which is a schematic drawing of another embodiment of an EEPROM cell according to the present invention. EEPROM 80 is similar to EEPROM 20 discussed above in that the charge stored on the floating gate 83 controls the conductivity of the channel between drain 81 and source 82. The charge is transferred to floating gate 83 via a programming electrode 86 through tunneling window 85. During the programming operation programming electrode 86 and control gate 84 are operated essentially as described above with respect to EEPROM 20.

The device is also erased in the manner described above with reference to EEPROM 20.

EEPROM 80 differs from EEPROM 20 in that a second programming electrode 87, referred to as the balancing electrode in the following discussion, is utilized to eliminate the voltage offset discussed above. The manner in which balance electrode 87 is utilized to remove the offset can be more easily understood with respect to a simple programming example. Consider the case in which EEPROM 80 is programmed by ramping the voltage on programming electrode 86 from 0 to V while holding control gate 84 at ground. For the purposes of this example, assume that the capacitative coupling between balance electrode 87 and floating age 83 is the same as the capacitative coupling between programming electrode 86 and floating gate 83. If the potential on balance electrode 87 is simultaneously ramped from 0 to −V, the offset introduced by balancing electrode 87 will cancel the offset produced by programming electrode 86.

While a system utilizing the scheme in the above example would work, it would suffer from two problems. First, the use of a negative potential introduces problems in fabricating the system. Ideally, only positive power should be required. The solution to this problem is based on the observation that an offset is acceptable so long as the offset remains constant during programming and reading. Hence, any programming scheme in which the sum of the contributions to the offset provided by the balancing and the programming electrodes is constant during programming will function adequately, provided the sum of the two contributions is also present during reading. For example, consider the case in which the capacitative couplings remain the same and the electrodes are ramped such that programming electrode 86 is ramped from 0 to V and balancing electrode 87 is ramped from V to 0. In this case, after programming, programming electrode 86 is tied to ground and balancing electrode 87 is tied to V during reading. It will be apparent that floating gate 83 is subjected to the same offset that would occur if the balancing electrode was connected to V and the balancing electrode to 0 at all times during the process.

Second, the balancing electrode should ideally be coupled to the floating gate through the same type of oxide as the tunneling gate to assure that the required symmetry exists between the two electrodes. However, if the same tunneling oxide arrangement is used, the tunneling could occur between the balancing gate and the floating gate after the EEPROM is programmed. To avoid such tunneling, the preferred embodiment of the present invention makes use of the observation that tunneling is a very non-linear process, and hence, there is a voltage threshold below which significant tunneling cannot occur. As long as the potentials placed on the balancing electrode are less than this threshold, no tunneling will occur. Hence, in the preferred embodiment of the present invention, the area of the window between the floating gate and the balancing electrode is three times larger than the window between the floating gate and the programming electrode. During programming, voltage applied to the balancing electrode is (V−v)/3 where V is the maximum potential applied to the programming electrode and v is the current potential on the programming electrode. The programming electrode is then tied to 0 and the balancing electrode to V/3 after programming is completed. It should be noted that the factor of 3 is somewhat arbitrary. The optimum factor for any particular design is a calculated tradeoff between programming voltage and device size.

Various modifications to the present invention will become apparent to those skilled in the art from the foregoing description and accompanying drawings. Accordingly, the present invention is to be limited solely by the scope of the following claims.

What is claimed is:

1. An electrically erasable, programmable memory cell formed on a semiconductor substrate, said memory cell comprising:

a source region in said substrate;

a drain region in said substrate;

a channel region connecting said source and drain regions when said channel region is conducting;

a floating gate overlying said channel region, the potential on said floating gate determining the conductivity of said channel region;

a programming electrode coupled to said floating gate by a tunneling window; and a programming gate overlying said floating gate, wherein said floating gate and said programming gate are capacitively coupled with a coupling capacitance of $C_{pf}$, and said programming electrode and said floating gate are also capacitively coupled with a coupling capacitance of $C_{if}$, and wherein $C_{pf} > 10\ C_{if}$.

2. A non-volatile memory comprising a plurality of data memory cells, a data programming circuit, and a first data line, wherein each data memory cell comprises an EEPROM cell and first and second isolation transistors, said EEPROM cell comprising a source region in said substrate;

a drain region in said substrate;

a channel region connecting said source and drain regions when said channel region is conducting;

a floating gate overlying said channel region, the potential on said floating gate determining the conductivity of said channel region;

a programming electrode coupled to said floating gate by a tunneling window; and a programming gate overlying said floating gate, wherein said first isolation transistor connects one of said source and drain regions of said EEPROM cell to said first data line in response to a selection control signal being coupled to that isolation transistor and said second isolation transistor connects said programming electrode to said data programming circuit in response to a write enable signal being coupled to that second isolation transistor, and wherein said data programming circuit programs a selected one of said data memory cells by receiving a data value to be stored in that data memory cell and generating and coupling a programming signal to said second isolation transistors, said programming signal having a duration determined by said received data value.

3. The memory of claim 2 wherein said data programming circuit comprises a conductance comparison circuit, said conductance comparison circuit comparing the conductance of said first data line with a conductanace value determined by said data value and terminates said programming signal when said compared conductances have a predetermined relationship.

4. The memory circuit of claim 3 wherein said conductance comparison circuit comprises a current mirror and a comparator, said current mirror causing a current to flow through said first data line and a current proportional to said current flowing through said first data line to flow through a resistor having a resistance determined by said data value;

and said comparator comparing a potential across said resistor with a reference potential.

5. The memory of claim 2 wherein said programming signal comprises a voltage ramp.

6. The memory of claim 2 wherein said programming signal comprises a series of pulses.

7. The memory of claim 2 wherein said programming signal is a DC signal.

8. The memory of claim 2 further comprising a plurality of first reference memory cells, a first reference programming circuit, and a first reference line, each first reference memory cell comprising an EEPROM cell and first and second isolation transistors, said EEPROM cell comprising a source region in said substrate;

a drain region in said substrate;

a channel region connecting said source and drain regions when said channel region is conducting;

a floating gate overlying said channel region, the potential on said floating gate determining the conductivity of said channel region;

a programming electrode coupled to said floating gate by a tunneling window; and a programming gate overlying said floating gate, wherein said first isolation transistor connects one of said source and drain regions of said EEPROM cell to said first reference line in response to a selection control signal being coupled to that isolation transistor and said second isolation transistor connects said programming electrode to said first reference programming circuit in response to a write enable signal being coupled to that second isolation transistor, and wherein said first reference programming circuit programs a selected one of said reference data cells by coupling a first reference programming signal to said second isolation transistors.

9. The memory of claim 8 wherein there is one first reference memory cell corresponding to each data memory cell and wherein that first reference cell is programmed each time said corresponding data memory cell is programmed.

10. The memory of claim 9 further comprising a read circuit, said read circuit comprising:

a read selection circuit for selecting a first one of said data memory cells and said first reference memory cell corresponding to that data memory cell; and a data reading circuit for comparing the conductance of said first data line to said first reference line when said EEPROM cell in said selected data memory cell is connected to said first data line and said EEPROM memory cell in said corresponding reference memory cell is connected to said first reference line, said data reading circuit generating an output value depending on said compared conductances.

11. The memory of claim 10 further comprising a plurality of second reference memory cells, a second reference programming circuit, and a second reference line, each second reference memory cell comprising an EEPROM cell and first and second isolation transistors, said EEPROM cell comprising a source region in said substrate;

a drain region in said substrate;

a channel region connecting said source and drain regions when said channel region is conducting;

a floating gate overlying said channel region, the potential on said floating gate determining the conductivity of said channel region;

a programming electrode coupled to said floating gate by a tunneling window; and a programming gate overlying said floating gate, wherein said first isolation transistor connects one of said source and drain regions of said EEPROM cell to said second reference line in response to a selection control signal being coupled to that isolation transistor and said second isolation transistor connects said programming electrode to said second reference programming circuit in response to a write enable signal being coupled to that second isolation transistor, wherein said second reference programming circuit programs a selected one of said reference data cells by coupling a second reference programming signal to said second isolation transistors of said second reference memory cells, wherein there is one second reference memory cell corresponding to each data memory cell and wherein that second reference cell is programmed each time said corresponding data memory cell is programmed, and wherein said data reading circuit also compares the conductance of said first data line to the conductance of said second reference line when said EEPROM cell in said selected data memory cell is connected to said first data line and said EEPROM memory cell in said corresponding second reference memory cell is connected to said second reference line, said data reading circuit generating an output value depending on said compared conductances of both said first and second reference lines.

12. The memory of claim 11 wherein said data reading circuit includes a circuit for interpolating the conductances of said first and second reference lines to obtain a conductance that matches the conductance of said first data line.

\* \* \* \* \*

UNITED STATES PATENT AND TRADEMARK OFFICE
CERTIFICATE OF CORRECTION

PATENT NO. : 6,154,392
DATED : November 28, 2000
INVENTOR(S) : Patti

It is certified that error appears in the above-identified patent and that said Letters Patent is hereby corrected as shown below:

column 1, line 31: Insert -- bits -- after "256"

column 6, line 3: Replace "charged" with -- charge -- between "the" and "placed' column 7, line 13: Replace "age" with -- gate -- after "floating"

Signed and Sealed this

Twenty-ninth Day of May, 2001

Attest:

NICHOLAS P. GODICI

Attesting Officer

Acting Director of the United States Patent and Trademark Office